United States Patent [19]

Fowle et al.

[11] Patent Number: 5,041,242
[45] Date of Patent: Aug. 20, 1991

[54] CONDUCTIVE COATING COMPOSITION

[75] Inventors: Robert Fowle, Puslinch; Steven Lohnes, Brampton, both of Canada

[73] Assignee: Cappar Limited, Brampton, Canada

[21] Appl. No.: 296,096

[22] Filed: Jan. 12, 1989

[51] Int. Cl.$^5$ .............................................. H01B 1/06
[52] U.S. Cl. .................................. 252/511; 252/502; 524/495; 524/496
[58] Field of Search ................ 252/511, 502; 524/495, 524/496, 589, 590

[56] References Cited

U.S. PATENT DOCUMENTS

| | | | |
|---|---|---|---|
| 4,526,952 | 7/1985 | Zeitler et al. | 524/496 |
| 4,547,311 | 10/1985 | Sako et al. | 252/511 |
| 4,624,801 | 11/1986 | Kawaguchi et al. | 252/511 |
| 4,695,508 | 9/1987 | Kageyama et al. | 252/511 |
| 4,772,422 | 9/1988 | Hyibata et al. | 252/511 |

*Primary Examiner*—Josephine Barr
*Attorney, Agent, or Firm*—Sim & McBurney

[57] ABSTRACT

A composition for forming electrically-conductive coatings, consisting essentially of a water-urethane resin, a plurality of carbon pigments including carbon black and natural graphite, each carbon pigment having a different preselected average particle size, and sufficient water to permit dispersion of the resin and carbon pigments therethrough. The ratio of resin to total carbon pigment and the ratio of each carbon pigment to total carbon pigment is selected such that a coating formed upon air drying of the composition has a resistance of less than 1 ohms per square and as low as 0.15–0.3 ohms per square.

12 Claims, 2 Drawing Sheets

CONDUCTIVE COATING COMPOSITION

FIELD OF THE INVENTION

The invention relates generally to conductive coatings appropriate for cathodic protection of concrete structures reinforced with steel rods, electromagnetic isolation of rooms and chambers, heating applications and the like, and more particularly, to novel coating compositions with exceptional conductivity formed of water-borne urethane resins and conductive carbon pigments.

DESCRIPTION OF THE PRIOR ART

It is known to form a low-cost conductive coating composition by combining a synthetic resin binder, conductive carbon particulates and an appropriate solvent. Most commercially available coating compositions with exceptional conductivity use an acrylic resin binder. Such compositions may be applied to a surface by painting or spraying, and, once the solvent has evaporated, a conductive coating remains. Typical prior compositions and their use in cathodic protection of reinforced concrete structures can be understood with reference to U.S. Pat. No. 4,632,777 which issued on Dec. 30, 1986 to John P. Nicholson.

The conductivity of such prior coatings has been dependent largely on carbon content. In order to enhance conductivity, the general approach has been to increase carbon content as much as possible. Coatings formed from such prior compositions have typically displayed a resistance in the range of about 10 to 50 ohms per square. The lower limit of this range of conductivity is approached with ratios of carbon particulates to acrylic resin binder in excess of about 500:100 by weight. The resultant coatings tend to be structurally weak owing to the minimal amount of acrylic binder in the coating composition, and enhancing coating conductivity further by simply increasing the weight percent of carbon particulates does not appear practical. Coating compositions based on acrylic binders and carbon particulates said to produce coatings with a resistance approaching 1 ohms have been reported, but the inventors are unaware that any such composition has been commercialized and are unaware whether any such coatings have durable physical properties.

It would be desirable to provide alternative compositions for forming conductive coatings which are both durable and highly conductive.

SUMMARY OF THE INVENTION

The inventors have discovered that durable conductive coatings with excellent conduction characteristics can be produced with coating compositions comprising water-borne urethane resins and carbon pigments. It has been discovered that, by appropriate selection and combining of the constituent materials, durable coatings with a resistance of less than 1 ohm per square and as low as 0.15-0.3 ohms per square can be produced, the latter resistance range indicating a conductivity one to two orders of magnitude better than that obtained from most commercially available coating compositions involving acrylic resin binders and conductive carbon particulates and approaching the conductivity heretofore obtained only with compositions incorporating highly conductive metal particulate such as copper and silver.

In one aspect, the invention provides a composition for forming electrically-conductive coatings, comprising a water-borne urethane resin and conductive material consisting essentially of plurality of carbon pigments; that is, the conductivity required to be achieved by the coating composition, when dry, is a attributable essentially to carbon pigments. The carbon pigments comprise at least a carbon black and a graphite, the average particle size of the graphite being "significantly larger" than the average particle size of the carbon black, that is orders of magnitude larger. The dry weight ratio of total carbon pigment to urethane resin, the dry weight ratio of each carbon pigment to total carbon pigment, and the pigment particle sizes are selected such that a coating formed upon drying of the composition has a resistance of between about 0.15 and about 6.4 ohms per square.

For purposes of the present specification and the appended claims the term "ohms per square" is to be understood according to conventional industry testing standards involving placing square electrodes of equal surface area against the coating with one side of one electrode spaced from one side of the other electrode by the length of one side of the square, and for a coating thickness of about 3 mils. The term "carbon pigment" is intended to denote conductive carbon particulates of either a particular type or average particle size, including materials such as carbon black, manufactured carbon and natural flaked graphite. Term "water-borne urethane resin" should be understood in conventional industry terms, namely, as a urethane resin carried in water as opposed to a solvent-based resin.

Other aspects of the invention will be apparent from a description of a preferred embodiment below, and will be more specifically identified in the appended claims.

DESCRIPTION OF THE DRAWINGS

The invention will be better understood with reference to drawings in which.

DESCRIPTION OF THE PREFERRED EMBODIMENTS

Figure 1:
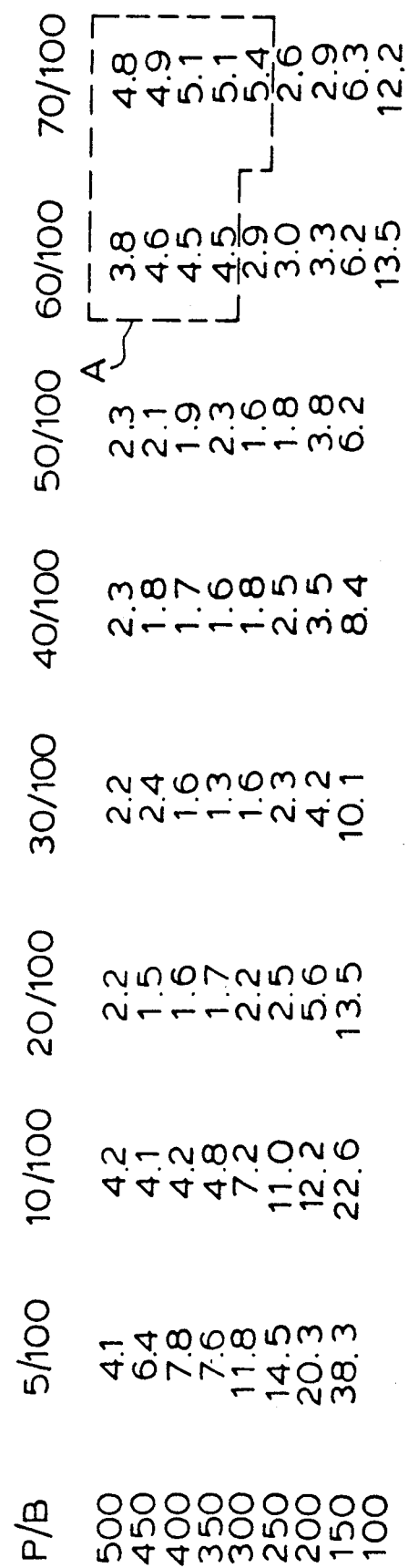
FIG. 1 is a table indicating how conductivity of a coating composition formed of water-borne, air-drying urethane resin and carbon pigments varies with changes in the relative proportions of each constituent components.

FIG. 1 is a table displaying the resistance of coatings produced through actual testing of coating compositions. The coating compositions used in such tests were composed of an aliphatic urethane resin and two types of carbon pigment, namely, carbon black and natural graphite. These components are mixed with water in sufficient quantities to permit dispersion of the various materials therethrough. The quantity of water used is not critical, as the water is largely evaporated during formation of a coating. The amount of water used should be sufficient to permit proper application of the coating composition to a surface, as by brushing or spraying, a matter which will be apparent to those skilled in producing paints. The applied coating is simply allowed to air dry, the urethane resin curing into a hard polyurethane film with embedded carbon pigment.

A suitable urethane resin is commercially available from Polyvinyl Chemicals Canada Ltd. of Brantford, Ontario, Canada, under the designation NEOREZ R-

960. A suitable carbon carbon black is a medium grade product available under the designation Vulcan XC-72 from Cabot Corporation. Such carbon black has a sieve residue of a maximum of 0.001 percent through U.S. No. 35 mesh and a maximum of 0.10 percent through U.S. No. 325 mesh. The average particle size is about 30 millimicrons. A suitable natural graphite is commercially available under the designation Natural Crystalline Graphite-185 from Prescott & Company (Canada) Ltd. of Mississauga, Ontario, Canada. Such natural graphite is specified as leaving a 15% residue through a 100 mesh sieve. It is characterized by average particle size of about 150 microns. The conductivity of coatings produced from similar materials obtained from different sources are expected to vary to some degree from those indicated in FIGS. 1 and 2. Compositions should be tested and adjusted empirically to accommodate the characteristics of particular constituent materials.

The leftmost column of the table in FIG. 1 headed by the expression "P/B" indicates the ratio by weight of total carbon pigment to urethane binder used in a particular coating composition. The manner of designation conforms to accepted practice in the paint industry. Each figure in the column assumes arbitrarily that the binder content is 100 units and indicates the relative proportion of total carbon pigment. Accordingly, the numeric designation "500" at the top of the column indicates a ratio by weight of total carbon pigment to urethane resin of 500:100. The ratios across the top of the table indicate the relative ratio by weight of the two distinct carbon pigments used in the composition, namely, the ratio of carbon black to natural graphite. Thus, for example, the ratio "10/100" indicates 10 units of carbon black to 100 units of natural graphite by weight. The values in the body of the table indicate resistance in ohms for a coating formed of any particular composition identified. This resistance was measured for coatings having particular dimensions and using a particular point-to-point resistance measuring arrangement. The film thicknesses were in the order of about 3 mils. The values indicated can be transformed into per square values by dividing each indicated value by 6.

Figure 2:
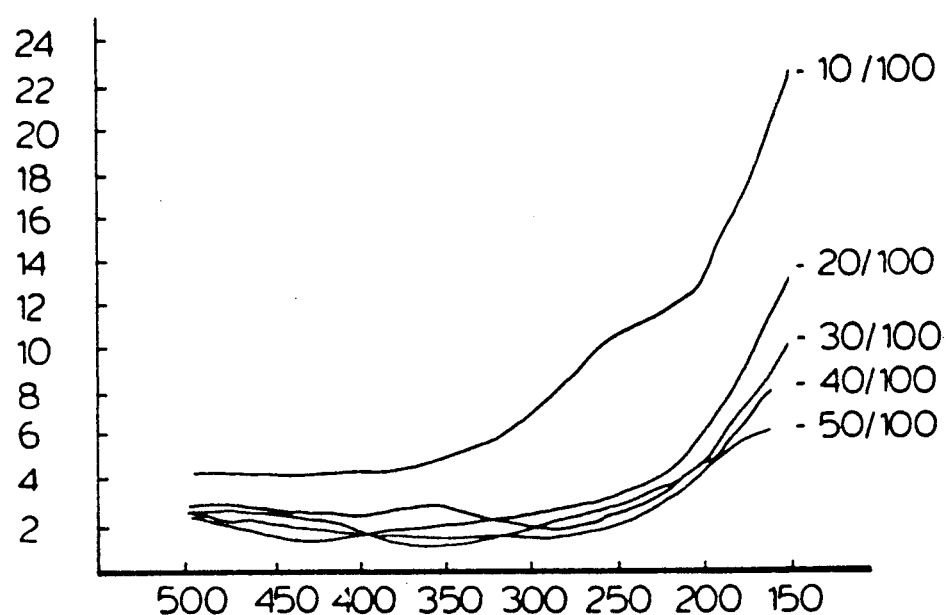
FIG. 2 is a graphic representation of certain data contained in the table of FIG. 1.

The graph of FIG. 2 has been developed from the data in the table of FIG. 1. The vertical axis represents the resistance in ohms of the coating produced with a particular coating composition (which is related to resistance per square according to the relationship described above). The horizontal axis denotes the ratio of total carbon pigment to urethane resin by weight. For example, the numeric designation "500" indicates once again a ratio of total carbon pigment to urethane resin of 500:100 by weight. The individual curves illustrated in FIG. 2 are labeled with the ratio by weight of carbon black to natural graphite in the carbon pigment of coating compositions associated with each curve. Accordingly, the designation "10/100" adjacent the uppermost curve indicates 10 parts of carbon black to 100 parts of natural graphite by weight.

The broad preferred range of compositions involve a ratio of resin to total carbon pigment between about 150:100 and 500:100 by weight, and a ratio of carbon black to natural graphite between about 5:100 and 70:100 by weight. As evident from the table of FIG. 1, such compositions have produced conductive coatings have an resistance of in the order of about 1 ohm per square and less. Although compositions with a resin to carbon pigment ratio in excess of 500:100 would appear likely to provide coatings with excellent conductivity, these are not preferred because of the quantity of water required to disperse the various particulates therethrough. In that regard, it should be noted that in increasing the resin to carbon pigment ratio from 500:100 to 550:100, the quantity of water required would roughly double. Such highly-watered coating compositions tend to produce relatively thin coatings and may not be effective or convenient in certain applications such as those involving coatings for cathodic protection.

The strongly preferred range of compositions involves a ratio of resin to total carbon pigment between about 200:100 and 500:100 by weight and a ratio of carbon black to graphite between about 20:100 and 50:100 by weight. As apparent from the table of FIG. 1, the coatings produced from such compositions have shown a conductivity markedly less 1 ohms per square and in many instances approaching 0.2–0.3 ohms per square. The most preferred composition (not indicated in the table and graph of FIGS. 1 and 2) involves a ratio of resin to total carbon pigment of about 305:100 by weight and a ratio of carbon black to graphite of about 30:100 by weight. This has produced in tests a coating having a resistance of about 0.15 ohms per square.

The inventor's have observed a number of effects which are apparent from the data in FIGS. 1 and 2. First, the conductivity of a polyurethane coating produced with the constituent materials described above tends to increase at least initially with increases in total carbon pigment relative to urethane binder. Second, the conductivity of such coatings tend to increase at least initially as the ratio of carbon black to natural graphite is increased. Lastly, the two factors are not independent. Successive increases in the relative proportion of graphite to total carbon pigment at lower ratios of total carbon pigment to urethane binder (such as 150:100 or 200:100) tend to produce successive increases in coating conductivity. However, as the urethane binder is loaded with increasing quantities of carbon pigment, increasing the ratio of carbon black to total carbon pigment tends eventually to impair the conductivity of the resultant coating. This becomes evident in the table of FIG. 1 by scanning horizontally across the resistance values associated with pigment to binder ratios in excess of 200:100, the effect becoming progressively more pronounced at higher ratios.

The experimental results are believed attributable to a number of mechanisms. First, the urethane resin is believed to wet the carbon particulates rather poorly thereby resulting in direct surface contact between the larger carbon particulates. It is believed that these larger natural graphite particulates provide relatively long conductive pathways through the coating thereby reducing the overall resistance of the coating. Surface contact resistance and gaps between the larger natural graphite particulates tends to to reduce overall conductivity. In that regard, the distribution of finer carbon black particulates throughout the coating composition is believed to reduce the resistance that current flows experience between the larger carbon particulates, effectively forming a conductive bridge between the larger carbon particulates themselves. Since on a per unit weight basis the finer carbon particulates present a larger surface area for wetting by the urethane resin, excessive quantities of the finer carbon black pigment, especially at high overall pigment content, tend to cause crazing in the resultant coating thereby impairing the conductive characteristics of the coating. Such crazing has been observed in varying degrees in the compositions identified by the reference character A in the table of FIG. 1, which nevertheless display excellent conductivity.

Accordingly, to produce a coating composition using a water-borne urethane resin binder and carbon pigments and having exceptional conductivity, less than about 1 ohm per square and preferably as low as 0.15–3. ohms per square, it is necessary to use a plurality of carbon pigments, each of a different preselected average particles size. The larger pigments tend to produce longer conductive pathways through the resultant coating; the smaller pigments tending to reduce resistance between the larger particles. The ratio of total carbon pigment to urethane binder and the relative ratio of each carbon pigment to total carbon pigment must be appropriately selected, preferably through empirical testing.

Coating compositions using urethane resin binder and three distinct carbon pigments, namely, carbon black, manufactured graphite, and natural graphite have also been tested. The urethane resin, carbon black and natural graphite were of the type described above. The manufactured graphite had an average particle size intermediate that of the carbon black and the natural graphite referred to above. One composition involved about 33 weight percent urethane resin, about 7 weight percent carbon black, about 15 weight percent of natural flaked graphite, and 12 weight percent of manufactured graphite, and about 33 weight percent water. The coating produced from this composition had a resistivity of about 0.6 ohms per square. Accordingly, it is within the ambit of the present invention to use more than two carbon pigments, but compositions involving only two distinct carbon pigment types are preferred as such compositions are more readily adjusted and tested to produce a coating with a desired conductivity.

A number of additives may be added to a coating composition embodying the invention. For example, a thixotrope such as hydroxy methyl cellulose at about 0.1 weight percent of total composition including water might might be added to stabilize the composition. Other additives such as cross-linking agents might be provided to alter the physical properties of the resulting polyurethane coating. Such additives are not, however, required to obtain coatings having excellent conductive properties. Materials such as stainless steel particulates might be added to alter the heat conduction characteristics of the resultant coatings.

It will be appreciated that particular embodiments of the invention has been described for purposes of illustrating the principles of the present invention and that modifications may be made therein without departing from the spirit of the invention and the scope of the appended claims.

We claim:

1. A composition for forming electrically-conductive coatings, comprising:
   a water-borne urethane resin;
   conductive material consisting essentially of a plurality of carbon pigments, the plurality of carbon pigments comprising at least a carbon black and a graphite, the graphite having an average particle size significantly greater than the average particle size of the carbon black;
   sufficient water to permit dispersion of the resin and the plurality of carbon pigments therethrough;
   the dry weight ratio of total carbon pigment to urethane resin, the dry weight ratio of each carbon pigment to total carbon pigment and the pigment particle sizes being selected such that a coating formed upon drying of the composition has a resistance of between about 0.15 ohms per square and about 6.4 ohms per square.

2. A composition as claimed in claim 1 in which the plurality of carbon pigments consists essentially of the carbon black and the graphite, the graphite is natural graphite, the dry weight ratio of total carbon pigment to urethane resin is between about 150:100 and 500:100, and the dry weight ratio of carbon black to natural graphite is between about 5:100 and 70:100.

3. A composition as claimed in claim 2 in which the carbon black has an average particle size of about 30 millimicrons and the natural graphite has an average particle size of about 150 microns.

4. A composition as claimed in claim 3 in which the dry weight ratio of total carbon pigment to urethane resin is between about 200:100 and 500:100, the ratio of carbon black to natural graphite is between about 20:100 and 50:100, and the coating formed upon drying of the composition has a resistance of less than about 1 ohm per square.

5. A composition as claimed in claim 3 in which the dry weight ratio of total carbon pigment to urethane resin is about 305:100, the dry weight ratio of carbon black to natural graphite is about 30:100, and the coating formed upon drying of the composition has a resistance of less than about 0.3 ohms per square.

6. An electrically-conductive coating comprising:
   polyurethane formed from a water-borne resin; and,
   conductive material dispersed throughout the polyurethane and consisting essentially of a plurality of carbon pigments, the plurality of carbon pigments comprising at least a carbon black and a graphite, the graphite having an average particle size significantly greater than the average particle size of the carbon black;
   the weight ratio of total carbon pigment to urethane resin, the weight ratio of each carbon pigment to total carbon pigment and the pigment particle sizes being such that the coating has a resistance of between about 0.15 ohms per square and about 6.4 ohms per square.

7. A coating as claimed in claim 6 in which in which the plurality of carbon pigments consists essentially of the carbon black and the graphite, the graphite is natural graphite, the dry weight ratio of total carbon pigment to urethane resin is between about 150:100 and 500:100, and the dry weight ratio of carbon black to natural graphite is between about 5:100 and 70:100.

8. A coating as claimed in claim 7 in which the carbon black has an average particle size of about 30 millimicrons and the natural graphite has an average particle size of about 150 microns.

9. A coating as claimed in claim 8 in which the weight ratio of total carbon pigment to polyurethane is between about 200:100 and 500:100, the ratio of carbon black to natural graphite is between about 20:100 and 50:100, and the coating formed upon drying of the composition has a resistance of less than about 1 ohm per square.

10. A coating as claimed in claim 8 in which the weight ratio of total carbon pigment to polyurethane is between about 305:100, the weight ratio of carbon black to natural graphite is about 30:100, and the coating formed upon drying of the composition has a resistance of less than about 0.3 ohms per square.

11. A composition for forming electrically-conductive coatings, consisting essentially of:
- a water-borne urethane resin;
- a plurality of carbon pigments comprising at least a carbon black and a graphite; the graphite having an average particle size significantly greater than the average particle size of the carbon black
- sufficient water to permit dispersion of the resin and the plurality of carbon pigments therethrough;
- the dry weight ratio of total carbon pigment to urethane resin, the dry weight ratio of each carbon pigment to total carbon pigment and the pigment particle sizes being selected such that a coating formed upon drying of the composition has a resistance of between about 0.15 ohms per square and about 6.4 ohms per square.

12. An electrically-conductive coating consisting essentially of:
- polyurethane formed from a water-borne resin; and,
- a plurality of carbon pigments dispersed throughout the polyurethane and comprising at least a carbon black and a graphite, the graphite having an average particle size significantly greater than the average particle size of the carbon black; and,
- the weight ratio of total carbon pigment to polyurethane, the weight ratio of each carbon pigment to total carbon pigment, and the pigment particle sizes being such that the coating has a resistance of between about 0.15 ohms per square and about 6.4 ohms per square.

* * * * *